United States Patent [19]
Tsuji

[11] Patent Number: 5,285,115
[45] Date of Patent: Feb. 8, 1994

[54] COMPARATOR DEVICE FOR COMPARING ANALOG VOLTAGES

[75] Inventor: Kazuhiro Tsuji, Yokohama, Japan

[73] Assignee: Kabushiki Kaisha Toshiba, Kawasaki, Japan

[21] Appl. No.: 827,648

[22] Filed: Jan. 29, 1992

[30] Foreign Application Priority Data

Jan. 31, 1991 [JP] Japan .................... 3-10660

[51] Int. Cl.⁵ .................. H03K 5/153; G11C 7/06
[52] U.S. Cl. .................... 307/362; 307/490; 307/491; 307/494; 307/497; 307/500; 307/530
[58] Field of Search .............. 307/355, 356, 360, 362, 307/490, 491, 494, 497, 500, 501, 530

[56] References Cited

U.S. PATENT DOCUMENTS

| | | | |
|---|---|---|---|
| 4,211,939 | 7/1980 | Furman | 328/127 |
| 4,439,694 | 3/1984 | Fox | 307/362 |
| 4,450,368 | 5/1984 | Spence | 307/362 |
| 4,461,965 | 7/1984 | Chin | 307/530 |
| 4,471,244 | 9/1984 | Maples | 307/530 |
| 4,551,641 | 11/1985 | Pelly | 307/530 |
| 4,559,498 | 12/1985 | Sokoloff | 328/127 |
| 4,572,974 | 2/1986 | Frieling et al. | 307/362 |
| 4,602,167 | 7/1986 | Yukawa | 307/355 |
| 4,707,624 | 11/1987 | Yee | 307/491 |
| 4,835,421 | 5/1989 | Khoury et al. | 307/491 |
| 4,894,559 | 1/1990 | Kaneko | 307/530 |
| 4,899,068 | 2/1990 | Klose et al. | 307/494 |
| 4,973,864 | 11/1990 | Nogami | 307/274 |
| 5,029,136 | 7/1991 | Tran et al. | 307/530 |
| 5,089,726 | 2/1992 | Chappell et al. | 307/530 |
| 5,113,090 | 5/1992 | Imaizumi et al. | 307/494 |

Primary Examiner—William L. Sikes
Assistant Examiner—Terry D. Cunningham
Attorney, Agent, or Firm—Banner, Birch, McKie & Beckett

[57] ABSTRACT

A comparator device comprising a offset-compensating comparator and a positive-feedback comparator. A reference voltage and an input voltage are applied to the input terminals of the offset-compensating comparator. The non-inverting and inverting output terminals of the offset-compensating comparator are connected to the inverting and non-inverting input terminals of the positive-feedback comparator, respectively. The positive-feedback comparator starts comparing the input voltage with the reference voltage before the offset-compensating comparator finishes comparing the input voltage with the reference voltage. Hence, the comparator device operates at high speed and has a great gain. In addition, the offset voltage can be reduced. A transistor is connected between the differential input terminals of the positive-feedback comparator, for setting both differential input terminals at the same potential at the time the comparator starts comparing the input voltage with the reference voltage. Therefore, the differential inputs to the positive-feedback comparator have no noise.

12 Claims, 10 Drawing Sheets

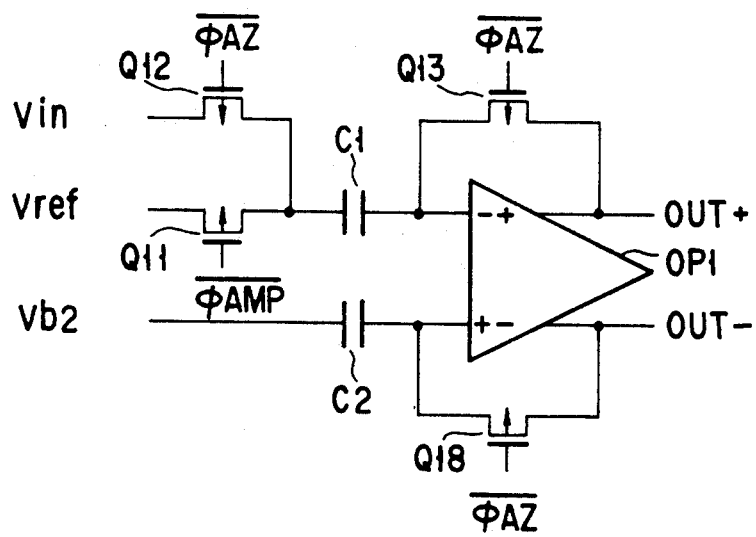
F I G. 5

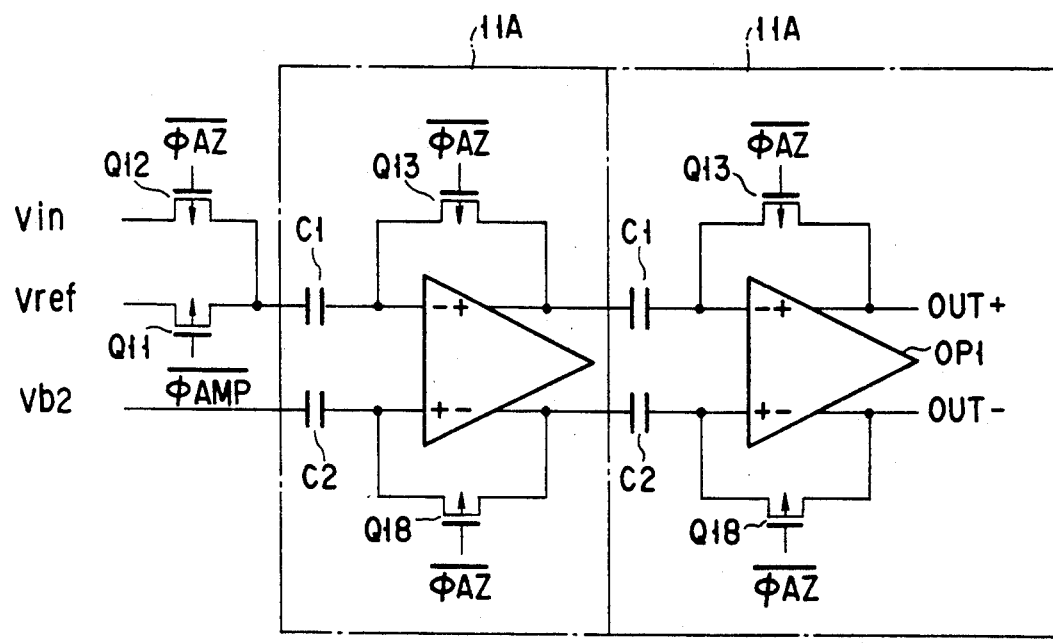
F I G. 6

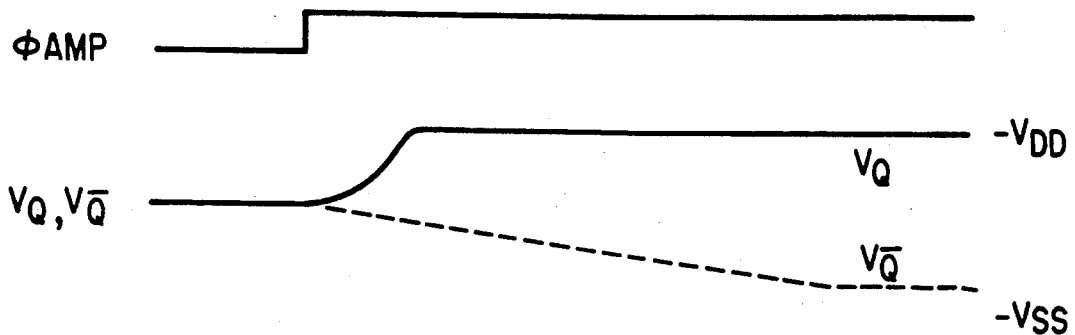
F I G. 7
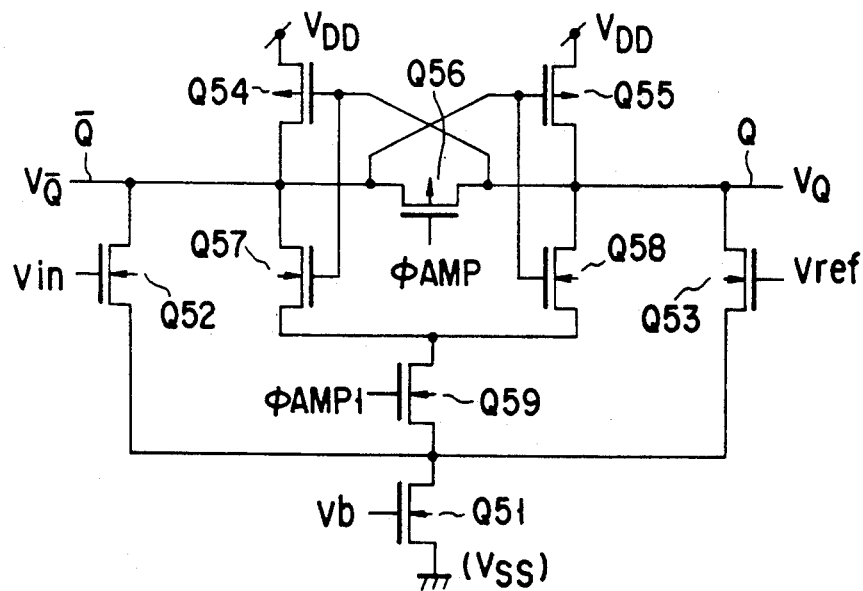
F I G. 8

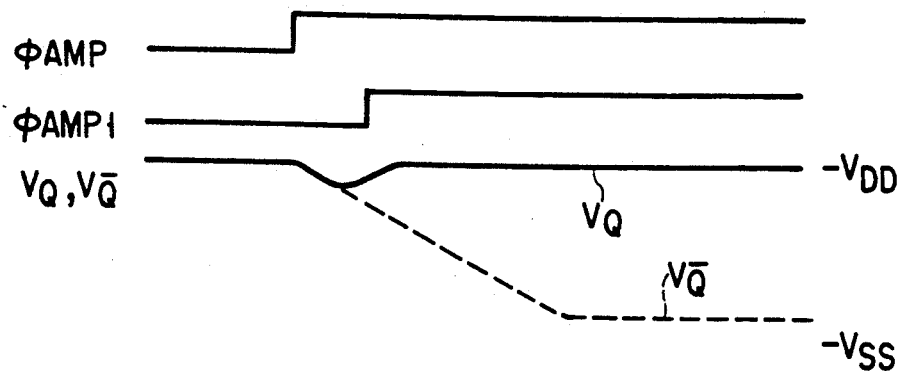
F I G. 11
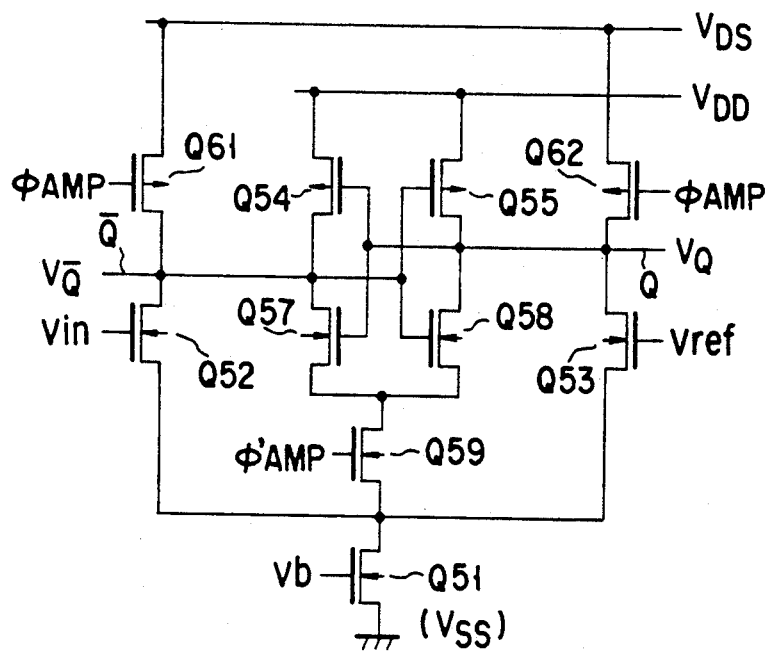
F I G. 12

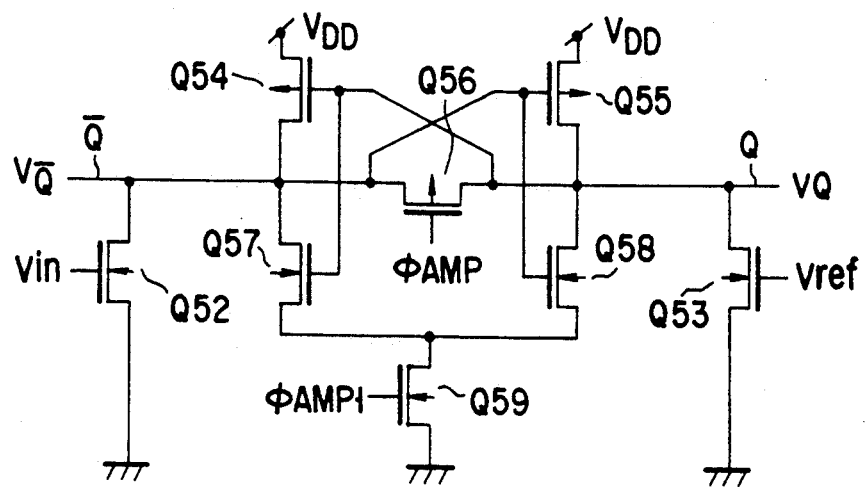
F I G. 13
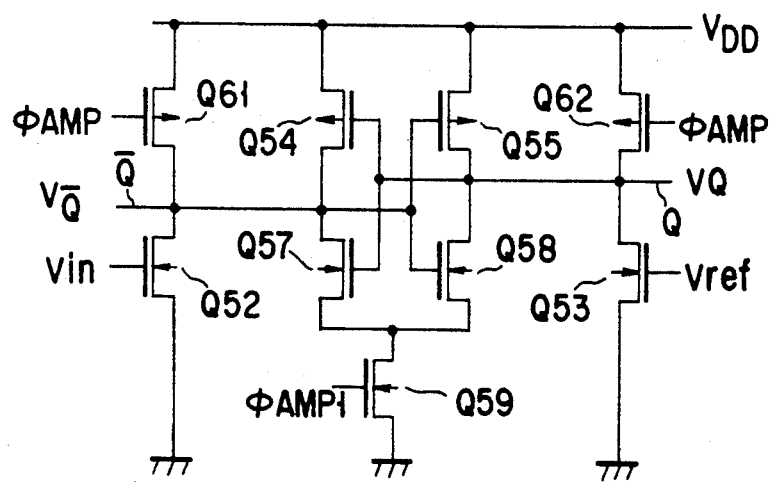
F I G. 14

COMPARATOR DEVICE FOR COMPARING ANALOG VOLTAGES

BACKGROUND OF THE INVENTION

1. Field of the Invention

The present invention relates to a comparator device for use in an A/D converter, and adapted to compare analog voltages.

2. Description of the Related Art

FIG. 17 shows the conventional comparator which is disclosed in A. G. F. Dingwall et al. "An 8 MHz CMOS Sub ranging 8 Bit A/D Converter," IEEE Journal Solid-State Circuits, Vol. SC-20, No. 6, December 1985, pp. 1138-1143. The comparator comprises a two inverter circuits which are connected in cascade, thereby to attain a gain greater than in the case where only one inverter circuit is used. More specifically, a reference voltage Vref is applied to the input of a switch S1, and an input voltage Vin is supplied to the input of another switch S2. The outputs of these switches S1 and S2 are connected by a capacitor C1 to the input of the first inverter circuit IV1. A switch S3 is connected between the input and output of the first inverter circuit IV1. The output of the inverter circuit IV1 is connected by a capacitor C2 to the input of the second inverter circuit IV2. A switch S4 is connected between the input and output of the second inverter circuit IV2. A control signal $\phi AZ$ controls the switches S1, S3, and S4. A control signal $\phi AMP$ controls the switch S2.

First, the control signal $\phi AZ$ turns on the switches S1, S3, and S4. The potentials across the capacitors C1 and C2 are then Vc1 - Vref and Vc2-Vc1, respectively, where Vc1 is the operation voltage of the inverter circuit IV1, and Vc2 is that of the inverter circuit IV2.

Next, the control signal $\phi AZ$ turns off the switches S1, S3, and S4, and the control signal $\phi AMP$ turns on the switch S2. Then, the input voltage V1i and output voltage V1o of the inverter circuit IV1, and the input voltage V2i and output voltage V2o of the the inverter circuit IV2 will be:

$$v1i = vc1 + (Vin - Vref)$$
$$v1o = Vc1 + A1(Vin - Vref)$$
$$V2i = Vc2 + A1(Vin - Vref)$$
$$V2o = Vc2 - A1A2(Vin - Vref)$$

where $-A1$ is the gain of the first inverter circuit IV1, and $-A2$ is the gain of the second inverter circuit IV2.

Obviously, the inverter circuit IV2 outputs a voltage which has been generated by amplifying the input voltage by the product of the gains of the inverter circuits IV1 and IV2, and has an offset voltage of "0." To enhance the gain of the comparator, more inverter circuits are coupled in cascade.

The time tAMP which the comparator shown in FIG. 17 needs to compare the input voltage Vin with the reference voltage Vref is substantially as long as tAMP1 +tAMP2, where tAMP1 is the time which lapses until the output voltage of the inverter circuit IV1 is determined after the input voltage thereof has been detected, and tAMP2 is the time which lapses until the output voltage of the inverter circuit IV2 is determined after the input voltage thereof has been detected. The time tAMP is about twice as long as the comparator should need to compare the input voltage Vin with the reference voltage Vref if it had only one inverter circuit. If the comparator comprised three or more inverter circuits to acquire a greater gain, the time tAMP would be inevitably longer. The same holds true of a comparator which comprises differential amplifiers.

FIG. 18 shows the positive-feedback comparator which is disclosed in ITEJ Technical Report, Vol. 14, NO. 32, pp. 7-12. The positive-feedback comparator has a gain which is theoretically infinite, and can compare an input voltage with a reference voltage within a short time. This comparator, however, has its offset not compensated for. Hence, if the metal oxide semiconductor field-effect transistors (MOSFETs) Q42 and Q43 have no identical characteristic, or if the MOSFETs Q44 and Q45 have no identical characteristic, there will be generated an offset voltage. Although the positive-feedback comparator operates at high speed, its offset voltage can hardly be minimized.

SUMMARY OF THE INVENTION

The object of the present invention is to provide a comparator which has a great gain, can operate at high speed, and in which an offset voltage can reduced.

According to the invention, there is provided a comparator device comprising:

a first comparator having a inverting input terminal, a non-inverting input terminal, a inverting output terminal, and a non-inverting output terminal, for generating an inverted voltage and a non-inverted voltage, both offset-compensated, from an input voltage and a reference voltage sequentially input to the inverting input terminal and a predetermined potential applied to the non-inverting input terminal, and for outputting the inverted voltage and the non-inverted voltage from the inverting output terminal and the non-inverted output terminal, respectively; and a second comparator of positive-feedback type having an inverting input terminal, a non-inverting input terminal, an inverting output terminal, and a non-inverting output terminal, for generating an inverted voltage and a non-inverted voltage from the inverted voltage and the non-inverted voltage, both output by the first comparator, and for outputting the inverted voltage and the non-inverted voltage from the inverting output terminal and the non-inverted output terminal, respectively.

In the comparator device of the invention, the first comparator generates an offset-compensated inverted voltage and an offset-compensated non-inverted voltage from the voltage and the reference voltage sequentially input to the first comparator, and the second comparator, which has a great gain, generates an inverted output and a non-inverted voltage from the offset-compensated inverted and non-inverted voltages applied from the first comparator as differential inputs. Therefore, the comparator device can operates at high speed with a great gain, and the offset voltage can reduced.

The comparator device according to the invention can further comprise switching means for setting the differential inputs to the second comparator at the same potential. When the inputs to the second comparator are set at the same potential, neither differential input will has noise. As a result, both inputs to the second comparator are stable.

Further, the comparator device of the invention can operate at high speed. This is because the second comparator, which is a positive-feedback one, starts comparing the differential inputs immediately before the first comparator finishes to comparing the input voltage with the reference voltage.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 5 is a diagram schematically showing the offset-compensated comparator incorporated in the comparator device shown in FIG. 2;

FIG. 6 is a circuit diagram showing a modification of the offset-compensated comparator of FIG. 5;

FIG. 7 is a timing chart explaining the operation of a conventional positive-feedback comparator;

FIG. 8 is a circuit diagram illustrating another embodiment of the positive-feedback comparator which can be incorporated in the comparator device of FIG. 2;

FIG. 11 is a timing chart explaining the operation of the positive-feedback comparator shown in FIG. 10;

FIG. 12 is a circuit diagram showing a modification of the positive-feedback comparator illustrated in FIG. 10;

FIG. 13 is a circuit diagram showing a modification of the positive-feedback comparator illustrated in FIG. 8;

FIG. 14 is a circuit diagram representing another modification of the positive-feedback comparator illustrated in FIG. 10;

DETAILED DESCRIPTION OF THE PREFERRED EMBODIMENT

An embodiment of the invention, i.e., a comparator device, will now be described, with reference to the accompanying drawings.

Figure 1:
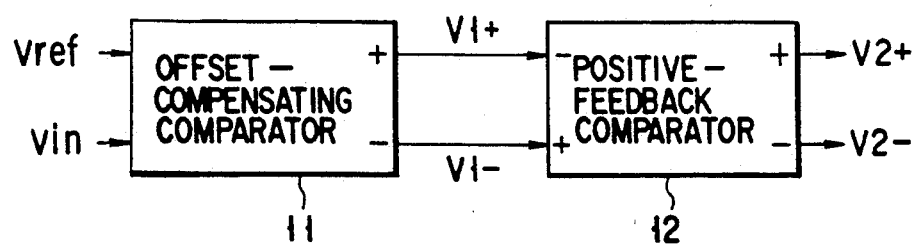
FIG. 1 is a block diagram showing a comparator device according to a first embodiment of the present invention.

As is shown in FIG. 1, the comparator device comprises an offset-compensating comparator 11 and a positive-feedback comparator 12. The offset-compensating comparator 11 has two input terminals, an inverting output terminal, and a non-inverting output terminal. The positive-feedback comparator 12 has an inverting input terminal, a non-inverting input terminal, an inverting output terminal, and a non-inverting output terminal. A reference voltage Vref and an input voltage Vin are applied to the input terminals of the offset-compensating comparator 11, respectively. The non inverting output terminal of the comparator 11 is connected to the inverting input terminal of the positive-feedback comparator 12. The positive-feedback comparator 12 outputs two voltages $V_{2+}$ and $V_{2-}$ from the non-inverted output terminal and the inverting output terminal, respectively.

The offset-compensating comparator has a gain A1. Its offset is compensated for, and hence is "0." The positive-feedback comparator 12 has a gain A2. An input offset voltage $2\Delta$ is applied to the comparator 12, whereby the inverting input terminal of the comparator 12 is set at a potential higher than the non-inverting input terminal thereof. Therefore:

$$V_{1+} = A1\ (Vref - Vin)$$
$$V_{1-} = -A1\ (Vref - Vin)$$
$$V_{2+} = -A2\ (V_{1+} - V_{1-} + 2\Delta)$$
$$\phantom{V_{2+}} = -2A1\ A2\ (Vref - Vin + \Delta/A1)$$
$$V_{2-} = -V_{2+}$$

Obviously, the offset voltage calculated from the voltage applied to this comparator device is $\Delta/A1$, and the offset of the positive-feedback comparator 12 is reduced by the gain of the offset-compensating comparator 11. Since the positive-feedback comparator 12 is connected to the output of the offset-compensating comparator 11, not vice versa, the comparator device has a great gain, and can finish comparing the input voltage Vin with the reference voltage Vref within a short time.

Figure 2:
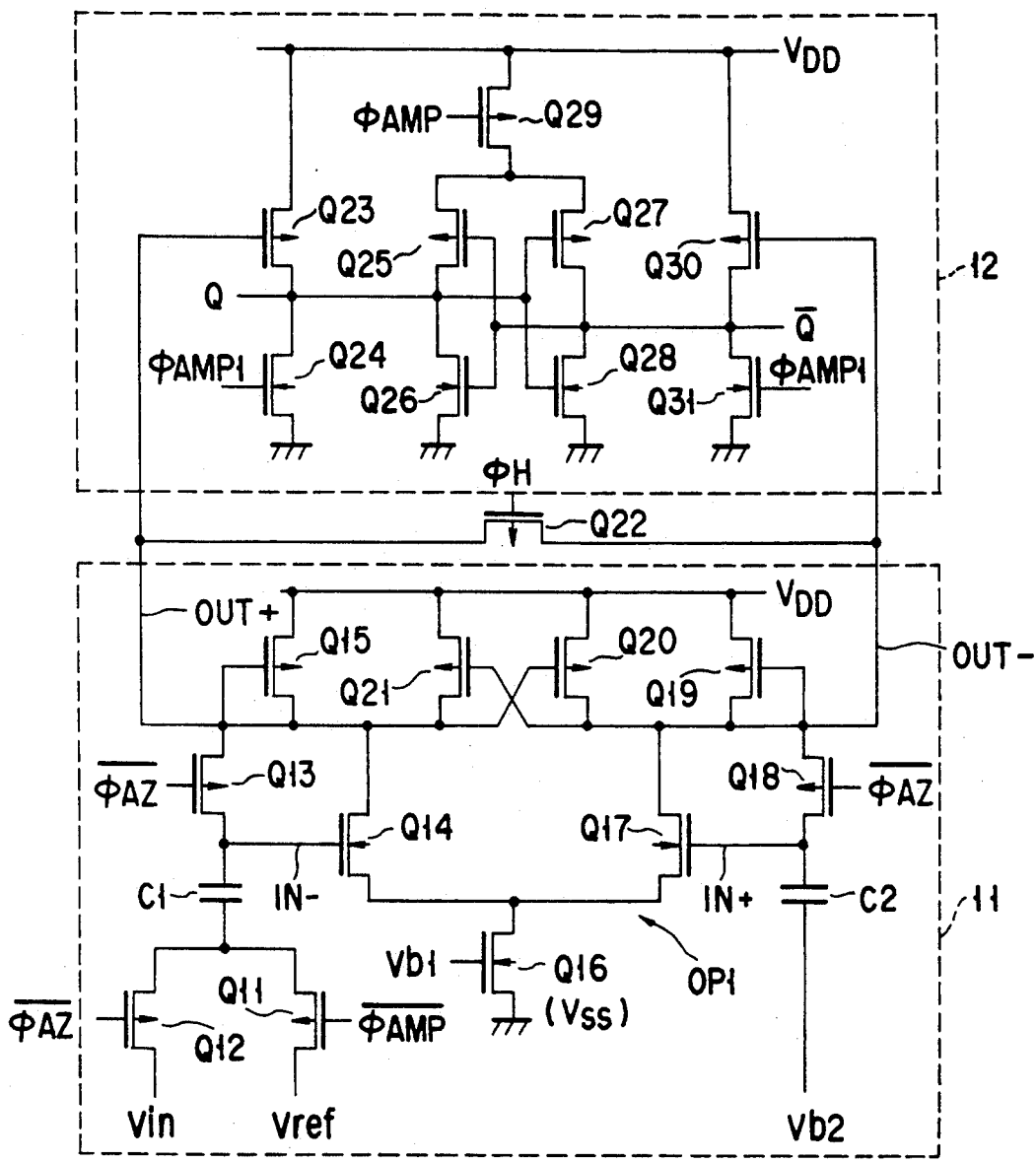
FIG. 2 is a circuit diagram showing the comparator device schematically illustrated in FIG. 1.

FIG. 2 shows the comparator device of FIG. 1, in greater detail. In the offset-compensating comparator 11, the reference voltage Vref is applied to the drain of a P-channel transistor Q11, and the input voltage Vin is applied to the drain of a P-channel transistor Q12. A control signal $\overline{\phi AMP}$ is supplied to the gate of the transistor Q11, and a control signal $\overline{\phi AZ}$ is applied to the gate of the transistor Q12. The sources of the transistors Q11 and Q12 are coupled to a capacitor C1. The capacitor C1 is connected to the drain of a P-channel transistor Q13 and also to the gate of an N-channel transistor Q14. The transistor Q14 is one of the components of a differential amplifier OP1. The control signal $\phi AZ$ is supplied to the gate of the transistor Q13. The source of the transistor Q13 is coupled to the gate and drain of a P-channel transistor Q15 and also to the gate of a P-channel transistor Q23 which is one of the components of the positive-feedback comparator 12.

The source of the transistor Q14 is connected to the drain of an N-channel transistor Q16, and also to the source of an N-channel transistor Q17. The source of the transistor Q16 is coupled to the ground (VS). A constant voltage Vb1 is applied to the gate of the transistor Q16. The gate of the transistor Q17 is connected by a capacitor C2 to a constant voltage source Vb2, and is directly connected to the drain of a P-channel transistor Q18. The control signal φAZ is supplied to the gate of this transistor Q18. The source of the transistor Q18 is connected to the source and gate of a P-channel transistor Q19, and also to the gate of a P-channel transistor Q30 which is a component of the positive-feedback comparator 12. The source of the transistor Q18 is connected to the drain of the transistor Q17, the drain of a P-channel transistor Q20, and the gate of a P-channel transistor Q21. The drain of the P-channel transistor Q21 is coupled to the drain of the transistor Q14 and also to the gate of the transistor Q20. The transistors Q15, Q19, Q20, and Q21 have their sources connected to a power supply $V_{DD}$.

A P-channel transistor Q22 is provided outside the offset-compensating comparator 11. This transistor Q22 is connected between the source of the transistor Q13 and the source of the transistor Q18. A control signal φH is supplied to the gate of the transistor Q22.

In the positive-feedback comparator 12, the source of the transistor Q23 is connected to the power supply $V_{DD}$, and the drain thereof is coupled to the non-inverting output terminal Q and also to the drain of an N-channel transistor Q24. The source of the transistor Q24 is connected to the ground. A control signal φAMP1 is supplied to the gate of the transistor Q24. The non-inverting output terminal Q is coupled to the drain of a P-channel transistor Q25, the drain of an N-channel transistor Q26, the gate of a P-channel transistor Q27, and the gate of an N-channel transistor Q28. The sources of the transistors Q25 and Q27 are connected by a P-channel transistor Q29 to the power supply $V_{DD}$. A control signal φAMP is supplied to the gate of the transistor Q29. The sources of the transistors Q26 and Q28 are connected to the ground. The gates of the transistors Q25 and Q26 and the drains of the transistors Q27 and Q28 are coupled to an inverting output terminal $\overline{Q}$, and also to the drain of the P-channel transistor Q30 and the drain of an N-channel transistor Q31. The source of the transistor Q30 is coupled to the power supply $V_{DD}$, and the gate thereof is connected to the source of the transistor Q18. The source of the transistor Q31 is coupled to the ground. The control signal φAMP1 is supplied to the gate of the transistor Q31.

The transistors Q15 and Q20 of the offset-compensating comparator 11 and the transistor Q23 of the positive-feedback comparator 12 constitute a current mirror. The transistors Q21 and Q19 of the offset-compensating comparator 11 and the transistor Q30 of the positive-feedback comparator 12 constitute a current mirror. The current defined by the transistor Q16 of the comparator 11 flows via these current mirrors. Hence, a constant-current source need not be coupled to the source of the transistor Q23, Q29, or Q30.

The operation of the comparator device shown in FIG. 2 will now be explained, with reference to the timing chart of FIG. 3.

While the control signal $\overline{\phi AZ}$ remains at low level, the transistors Q12, Q13, and Q18 of the offset-compensating comparator 11 are on. The input voltage Vin is thereby sampled, and the offset is compensated. When the control signal $\overline{\phi AMP}$ falls to low level, the transistor Q11 is turned on, whereby the reference voltage Vref is sampled and compared with the sampled input voltage Vin. How the offset-compensating comparator 11 performs its function will be described later, in detail.

In the positive-feedback comparator 12, while the control signal φAMP1 is at the low level, the output from the source of the transistor Q13 of the comparator 11 is supplied to the transistor Q23, whereas the output from the source of the transistor Q18 of the comparator 11 is supplied to the transistor Q30. These outputs are compared. The time at which the comparator 12 starts comparing these outputs is been set immediately before the offset-compensating comparator 11 finishes comparing the input voltage Vin with the reference voltage Vref. The result of this comparison the comparator 12 is held by the transistors Q25, Q26, Q27, and Q28. Therefore, the positive-feedback comparator 12 operates at high speed.

Figure 3:
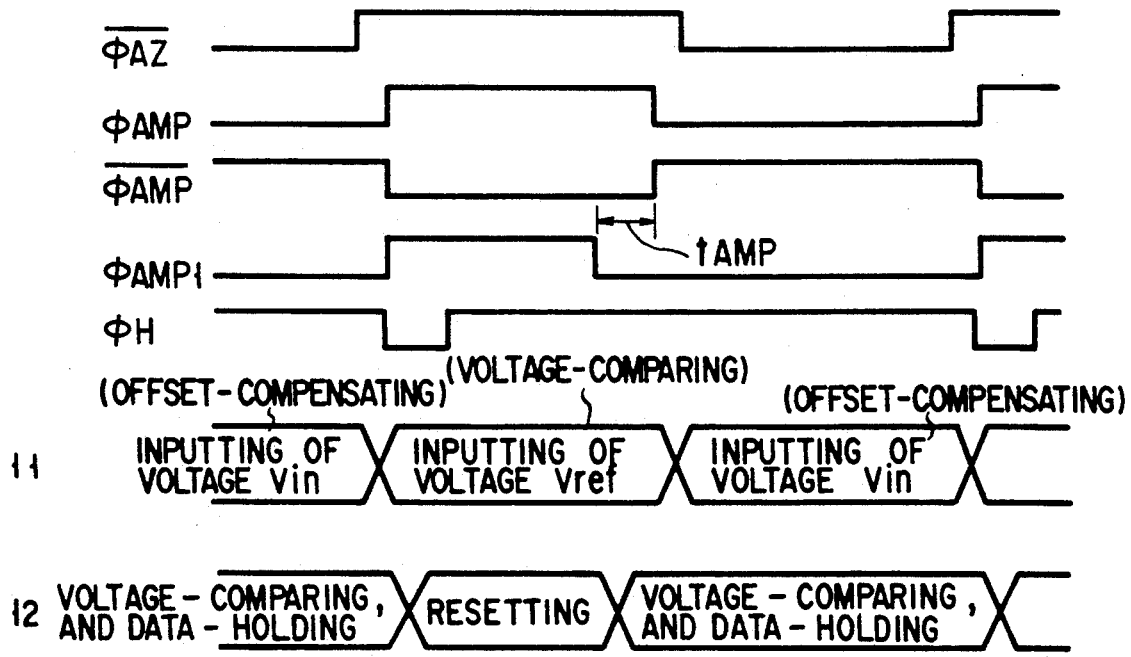
FIG. 3 is a timing chart explaining how the comparator device of FIG. 2 operates.

Time tAMP, shown in FIG. 3, is the period of time which lapses until the potential difference between the non-inverted output Q and the inverted output $\overline{Q}$ increases greater than the offset voltage of the positive-feedback comparator 12. The time tAMP can be extremely short, and the positive-feedback comparator 12 can then operate at high speed, only if the potential difference between then non-inverted output Q and the inverted output $\overline{Q}$ is greater than the offset voltage of the transistors Q23, Q25, Q27, and Q30.

As has been described, the positive-feedback comparator 12 operates at high speed even if it performs its function after the offset-compensating comparator 11 (i.e., the first-stage comparator) has compared the input voltage Vin with the reference voltage Vref. The positive-feedback comparator 12 operates at so high a speed that the time the comparator device, as a whole, requires to compare the input voltage Vin and the reference voltage Vref is only slightly longer than the time the offset-compensating comparator 11 requires to finish comparing the voltages Vin and Vref.

The gain of the offset-compensating comparator 11 reduces the offset voltage in the positive-feedback comparator 12. In addition, the gain of the comparator 11 is great due to the use of the positive-feedback comparator 12.

As may be understood from FIG. 2, the transistor Q22 is used for short-circuiting the differential input terminals of the positive-feedback comparator 12. Without this transistor Q22, the comparator device can perform its basic function. Nonetheless, it would be better, for the following two reasons, to use the transistor Q22 to stabilize the differential input voltages of the positive-feedback comparator 12.

(1) When the transistors Q24 and Q31 are turned on while the outputs Q and $\overline{Q}$ are at potentials $V_{DD}$ and $V_{SS}$, respectively, there is the possibility that the differential inputs of the positive-feedback comparator 12 contain noise, due to the gate-drain capacitances of the transistors Q24 and Q30.

(2) If there is a long time lag between the end of offset-compensating and the start of voltage-comparing in the offset-compensating comparator 11, the output voltages $V_{2+}$ and $V_{2-}$ of the positive-feedback comparator 12 inevitably change since the differential inputs to the comparator 12 are at high impedance during said time lag.

It will now be explained, in detail, how the offset-compensating comparator 11 operates.

Hitherto, chopper-type comparators, such as the one disclosed in Published Examined Japanese Patent Application No. 62-5376, have been employed to produce a high PSRR (Power-Supply Rejection Ratio) comparator device.

Figure 4:
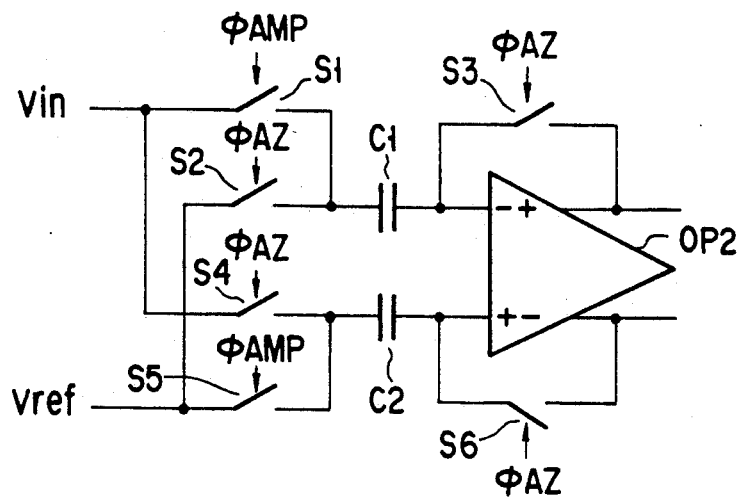
FIG. 4 is a diagram illustrating a conventional, offset-compensated comparator.

FIG. 4 shows the chopper-type comparator disclosed in the Japanese patent application. In this chopper-type comparator, a control signal $\phi$AZ first turns on the switches S2, S3, S4, and S6 and then turns off these switches. Next, a control signal $\phi$AMP turns on the switches S1 and S5, thereby reducing the offset voltage of the differential amplifier OP1. Therefore, the chopper-type comparator can compare an input voltage Vin with the reference voltage Vref with high accuracy.

The chopper-type comparator shown in FIG. 4 is disadvantageous, however. It cannot compare the voltages Vin and Vref if the voltage Vin input when the control signal $\phi$AZ turns on the switches S2, S3, S4, and S6 is different from the voltage Vin input when the control signal $\phi$AMP turns on the switches S1 and S5. Namely, since the inverting input terminal of the differential amplifier OP2 has an offset, and the non-inverting input terminal thereof has an offset greater than that of the inverting input terminal, the voltage VC1 across the capacitor C1 and the voltage VC2 across the capacitor C2 are:

$$VC1 = Vc + \{A/(1+A)\}\Delta - Vref$$

$$VC2 = Vc - \{A/(1+A)\}\Delta - Vrel$$

where A is the gain of the differential amplifier OP2, 2Δ is the input offset voltage, Vc is the mean value of the output voltage, and Vin1 is the value the input voltage Vin has when the control signal $\overline{\phi AZ}$ is at the high level.

When the control signals $\overline{\phi AZ}$ and $\phi$AMP are set at the low level and the high level, respectively, the voltage V_ at the inverting input terminal of the amplifier OP2 and the voltage V_+ at the non-inverting input terminal thereof have the following values:

$$V_- = Vc + \{A/(1+A)\}\Delta + (Vin2 - Vref)$$
$$V_- = Vc - \{A/(1+A)\}\Delta - (Vin1 - Vref)$$
$$(V_+ - V_- + 2\Delta)$$
$$= \{2/(1+A)\}\Delta + 2\{Vref - (Vin1 + Vin2)/2\}$$

where Vin2 is the value the input voltage Vin has when the control signals $\overline{\phi AZ}$ and $\phi$AMP are set at the low level and the high level, respectively. In this case, the offset voltage is $\{2/(1+A)\}\Delta$.

If the input voltages Vin1 and Vin2 are not equal, it is the voltage (Vin1+Vin2)/2 that the chopper-type comparator compares with the reference voltage Vref. In this case, it is no longer possible for the comparator to compare the input voltage Vin and the reference voltage Vref with sufficient accuracy. To enable the chopper-type comparator to compare the voltages Vin and Vref correctly, a sample-and-hold circuit must be used to hold the value of the input voltage Vin. The use of a sample-and-hold circuit inevitably makes the comparator larger.

By contrast, the offset-compensating comparator 11 shown in FIG. 2 can compare the input volt rage Vin and the reference voltage Vref with sufficiently high accuracy. It will be explained why so, with reference to FIG. 5 which schematically shows the comparator 11. In FIG. 5, the components identical to those shown in FIG. 2 are designated at the same symbols.

In the offset-compensating comparator 11, when the control signal $\phi\overline{AZ}$ turns on the transistors Q12, Q13, and Q18, and then these transistors Q12, Q13, and Q18 are turned off, the voltage VC1 across the capacitor C1 and the voltage VC2 across the capacitor C2 are:

$$VC1 = Vc + \{A/(1+A)\}\Delta - Vin0$$

$$VC2 = Vc - \{A/(1+A)\}\Delta - Vb$$

where A is the gain of the differential amplifier OP1, 2$\phi$ is the input offset (the potential at the inverting input terminal is higher than that at the non-inverting input terminal), Vc is the mean value of the output voltage, and Vin0 is the value the input voltage Vin has the moment the transistors Q12, Q13, and Q18 are turned off.

Next, the control signal $\phi\overline{AMP}$ turns on the transistor Q11, the voltages V_ and V_+ applied to the inverting input terminal and non-inverting input terminal of the differential amplifier OP1, respectively, come to have the following values:

$$V_- = Vc + \{A/(1+A)\}\Delta - (Vin0 - Vref) \quad (1)$$
$$V_+ = Vc - \{A/(1+A)\}\Delta$$
$$(V_+ - V_- + 2\Delta) = \{2/(1+A)\}\Delta + (Vin0 - Vref)$$

Obviously, the offset is $\{2/(1+A)\}\Delta$, as in the chopper-type comparator shown in FIG. 4.

In the differential amplifier OP1, the difference between the input voltage Vin and the reference voltage Vref is halved. It is nevertheless unnecessary to sample and hold the input voltage Vin since the voltage Vin is sampled the very moment the control signal $\phi\overline{AZ}$ falls to the low level. The input voltage Vin, which is a dynamic voltage, can be directly input to the differential amplifier OP1.

In the offset-compensating comparator 11 shown in FIGS. 2 and 5, the control signals $\phi\overline{AMP}$ and $\phi\overline{AZ}$ are supplied to the transistors Q11 and Q12, respectively. Instead, the control signals $\phi\overline{AMP}$ and $\phi\overline{AZ}$ may be supplied to the transistors Q12 and Q11, respectively. In the latter alternative case, the last term of equation (1) changes to (−Vin0,+Vref).

Also, in the comparator 11, the transistors Q11 and Q12 are coupled to the capacitor C1. These transistors can be connected to the capacitor C2, instead. In this case, too, the last term of equation (1) changes to (−Vin0,+Vref).

FIG. 6 illustrates a modification of the offset-compensated comparator 11 shown in FIG. 5. This modified comparator comprises two identical units 11A connected in series, each comprising two capacitors C1 and C2, transistors Q13 and Q18, and a differential amplifier OP1. As can be clearly understood from FIG. 6, the modified comparator has a greater gain than the comparator 11 shown in FIG. 5.

The positive-feedback comparator 12 will now be described in detail, in comparison with the conventional positive-feedback comparator shown in FIG. 18.

Figure 18:
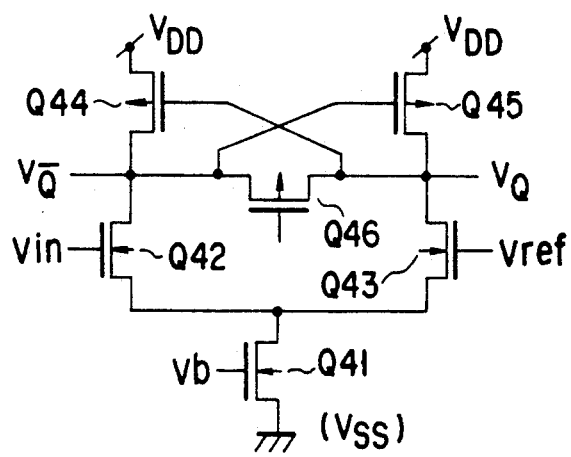
FIG. 18 is a circuit diagram showing a conventional positive-feedback comparator.

In the comparator of FIG. 18, the transistor Q46 is turned on, setting the output voltages VQ and V$\overline{Q}$ at the same value. Then, the transistor Q46 is turned off. If the input voltage Vin is higher than the reference voltage Vref, that is, if Vin>Vref, the source-drain current of the transistor Q42 is greater than that of the transistor Q43. Hence, VQ<V$\overline{Q}$. Since the output voltages V$\overline{Q}$ and VQ are applied to the gate of the transistor Q45 and the gate of the transistor Q44, respectively, the source-drain current of the transistor Q44 is less than that of the transistor Q45. The output voltage V$\overline{Q}$ approaches $V_{SS}$, whereas the output voltage VQ approaches $V_{DD}$ and hence becomes gradually smaller than the output voltage $V\overline{Q}$. Therefore, $VQ < V\overline{Q}$.

In the conventional positive-feed comparator shown in FIG. 18, if Vin > Vref, the output voltages VQ and $V\overline{Q}$ change with time as is illustrated in FIG. 7. The source-drain current IDS of the transistor Q45 is:

$$IDS = gmp(V_{DD} - V\overline{Q} - Vthp)$$

where gmp is the conductance of the transistor Q45, and Vthp is the threshold voltage of the transistor Q45. As the output voltage $V\overline{Q}$ decreases, the current flowing through the transistor Q45 increases, whereby the output voltage VQ fast approaches $V_{DD}$.

On the other hand, the output voltage $V\overline{Q}$ approaches $V_{SS}$, due to the operation of the transistors Q41 and Q42. If Vin and Vref are nearly equal, the source-drain current of the transistor Q42 is about half the source-drain current Ib of the transistor Q41. If the source-drain current Ib is comparatively small, it would take the output voltages VQ and $V\overline{Q}$ a long time to differ from each other as is illustrated in FIG. 7. Hence, it may be proposed that the current Ib be increased to shorten the time within which the comparator should finish comparing the input voltage Vin with the reference voltage Vref. An increase in the current Ib means a greater consumption of electric power, however.

FIG. 8 illustrates a positive-feedback comparator which can be incorporated in the comparator device of FIG. 2, in place of the comparator shown in FIG. 2. This comparator is different from the conventional one of FIG. 18, in that three additional transistors Q57, Q58, and Q59 are used to make the output voltage VQ, $V\overline{Q}$ approach $V_{SS}$.

More specifically, as is shown in FIG. 8, the input voltage Vin is applied to the gate of an N-channel transistor Q52. The drain of this transistor Q52 is connected to the inverting output terminal $\overline{Q}$ and also to the drain of the N-channel transistor Q57 and the drain of a P-channel transistor Q54. The source of the transistor Q52 is connected to the ground by an N-channel Transistor 51, and is coupled to the non-inverting output terminal Q by a transistor Q53. A constant voltage Vb is applied to the gate of the transistor Q51. The reference voltage Vref is applied to the gate of the transistor Q53. The drain of this transistor Q53 is coupled to the drain of the N-channel transistor 58 and also to the drain of a P-channel transistor Q55.

The drain of the transistor Q53 is connected to the inverting output terminal $\overline{Q}$ by a P-channel transistor Q56, and also to the gates of the transistors Q54 and Q57. A control signal $\phi$AMP is supplied to the gate of the transistor Q56.

The gates of the transistors Q55 and Q58 are connected to each other, and are coupled to the inverting output terminal $\overline{Q}$. The sources of the transistors Q57 and Q58 are connected to the drain of the N-channel transistor Q59. The source of this transistor Q59 is connected to the drain of the transistor Q51. A control signal $\phi$AMP1 is supplied to the gate of the transistor Q59. The sources of the transistors Q54 and Q55 are coupled to a power source $V_{DD}$.

Figure 9:
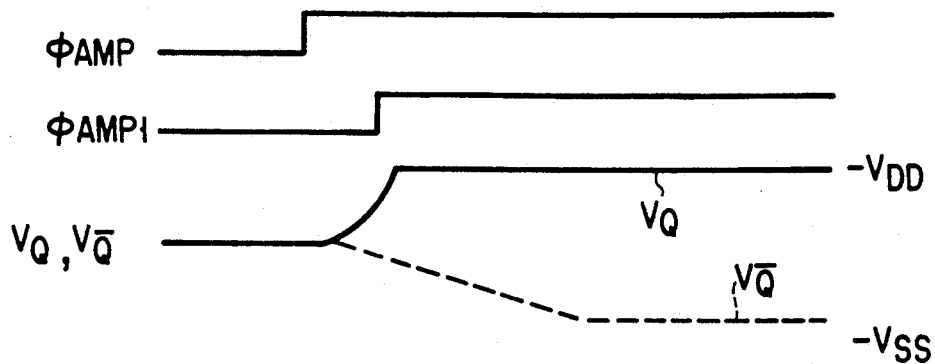
FIG. 9 is a timing chart explaining the operation of the positive-feedback comparator shown in FIG. 8.

FIG. 9 is a timing chart explaining how the comparator shown in FIG. 8 operates, or how the output voltages VQ and $V\overline{Q}$ of the comparator change with time when the input voltage Vin is higher than the reference voltage Vref, that is, when Vin > Vref. More precisely, when control signal $\phi$AMP is at the low level, the transistor Q56 is on, setting the output voltages VQ and $V\overline{Q}$ at the same value. Then, the transistor Q56 is turned off, whereby the output voltages VQ and $V\overline{Q}$ differ from each other. When the difference between the output voltages VQ and $V\overline{Q}$ increases to a predetermined value, the control signal $\phi$AMP1 rises to the high level, thus turning on the transistor Q59. Since $VQ > V\overline{Q}$, the source-drain current of the transistor Q57 is greater than that of the transistor Q58. Due to the source-drain current of the transistor Q57, the output voltage $V\overline{Q}$ approaches $V_{SS}$ even if the input voltage Vin is substantially equal to the reference voltage Vref. Since the comparator is of positive-feedback type, the maximum current that flows through the transistor Q57 is the source-drain current Ib of the transistor Q51. Hence, the comparator finishes comparing the voltages Vin and Vref within half the time during which the conventional positive-feed comparator shown of FIG. 18 compares the input voltage Vin with the reference voltage Vref.

Figure 10:
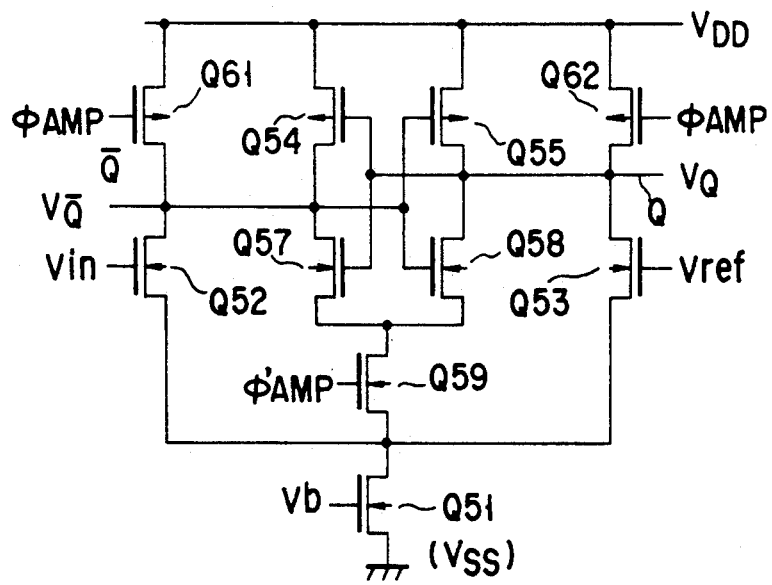
FIG. 10 is a circuit diagram illustrating another embodiment of the positive-feedback comparator which can be used in the comparator device of FIG. 2.

FIG. 10 shows another positive-feedback comparator which can be used in the comparator device of FIG. 2. This positive-feedback comparator is different from the comparator shown in FIG. 8 in three respects. First, it has no component equivalent to the transistor Q56 (FIG. 8). Second, a transistor Q61 is connected between the inverting output terminal $\overline{Q}$ and the power supply $V_{DD}$ and is controlled by a signal $\phi$AMP. Third, a transistor Q62 is connected between the non-inverting output terminal Q and the power supply $V_{DD}$ and is controlled by the control signal $\phi$AMP.

In operation, the control signal $\phi$AMP turns on transistors Q61 and Q62, as is illustrated in FIG. 11. As a result, the output voltages VQ and $V\overline{Q}$ are compared with the voltage $V_{DD}$. Thereafter, the comparator shown in FIG. 10 operates in the same way as the comparator shown in FIG. 8.

FIG. 12 shows a modification of the positive-feedback comparator illustrated in FIG. 10. The modified comparator is different in two respects only. First, the sources of the transistors Q54 and Q55 are connected to the power supply $V_{DD}$. Second, the sources of the transistors Q61 and Q62 are connected to a power supply $V_{DS}$. The modified positive-feedback comparator attains the same advantage as the positive-feedback comparator illustrated in FIG. 10.

FIG. 13 shows a modifications of the positive-feedback comparator illustrated in FIG. 8, and FIG. 14 shows a modification of the positive-feedback comparator shown in FIG. 10. The modified comparators of FIGS. 13 and 14 are different from the comparators of FIGS. 8 and 10 in two aspects only. First, they have no component corresponding to the transistor Q51. Second, the sources of transistors Q52, Q53, and Q59 are set at the ground potential $V_Q$. In these modified positive-feedback comparators, the output voltages VQ and $V\overline{Q}$ can be set at the power-supply voltage $V_{DD}$ and the ground potential $V_{SS}$, respectively.

The power consumption of the positive-feedback comparators shown in FIGS. 13 and 14 may vary, depending on the values of the input voltage Vin and the reference voltage Vref. Such variation of the power consumption can be eliminated by connecting a buffer circuit of the type shown in FIG. 15 to the input of the positive-feedback comparators.

Figure 15:
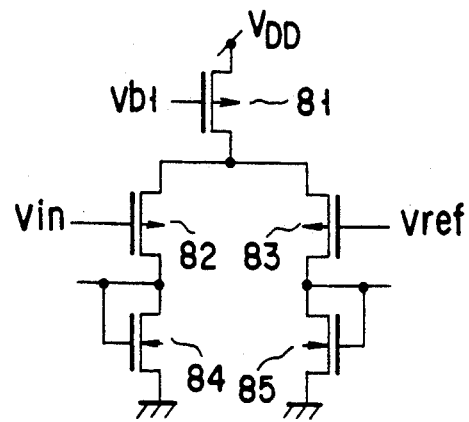
FIG. 15 is a circuit diagram showing the buffer circuit can be incorporated in the positive-feedback comparators shown in FIGS. 13 and 14.

As is shown in FIG. 15, the buffer circuit comprises a P-channel transistor Q81, two P-channel transistors Q82 and Q83, and two N-channel transistors Q84 and Q85. A low voltage Vb1 is applied to the gate of the transistor Q81. The source of the transistor Q81 is coupled to the power supply $V_{DD}$. The drain of the transistor Q81 is connected to the ground by the transistors Q82 and Q84 which are connected in series, and also by the transistors Q83 and Q85 which are connected in series. The input voltage Vin and the reference voltage Vref are applied to the gates of the P-channel transistors Q81 and Q83, respectively. The gate and drain of the transistor Q84 are connected to the gate of the transistor Q52 of the comparator shown in FIG. 13 or FIG. 14. The gate and drain of the transistor Q85 are connected to the gate of the transistor Q53 of the comparator shown in FIG. 13 or FIG. 14.

In the case where the buffer circuit of FIG. 15 is connected to the input of the comparator shown in FIG. 13 or 14, the transistors Q84 and Q52 constitute a current mirror, and the transistors Q85 and Q53 constitute a current mirror. Therefore, the currents flowing through the transistors Q52 and Q84 are equal, and the currents flowing through the transistors Q53 and Q85 are equal. As a result, variation of the power consumption of the comparator is prevented.

Figure 16:
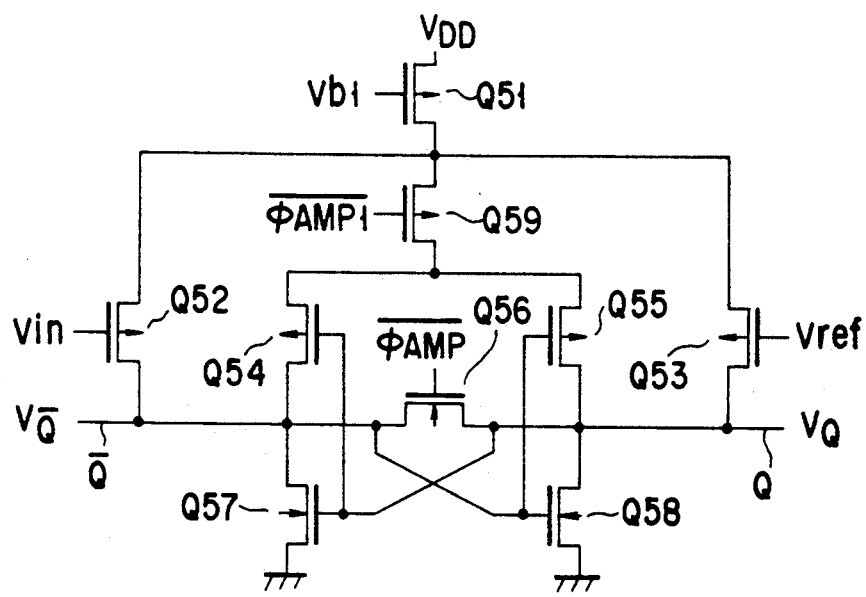
FIG. 16 is a circuit diagram illustrating a modification of the positive-feedback comparator shown in FIG. 8.
Figure 17:
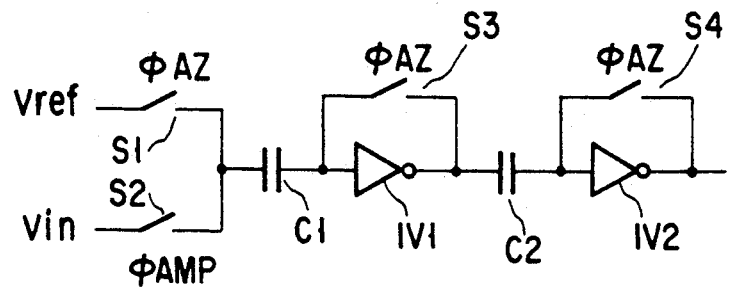
FIG. 17 is a circuit diagram showing a conventional comparator.

FIG. 16 shows a modification of the positive-feedback comparator shown in FIG. 8. This modified comparator is different from the comparator of FIG. 8, in two respects only. First, the transistor Q59 is connected to the source of the transistors Q54 and Q59. Second, the transistor Q51 is connected to a power source $V_{DD}$.

In the comparators shown in FIGS. 8, 10, 13, and 14, a P-channel MOSFET is used as an input transistor. Instead, an N-channel MOSFET can be used. In such case, the comparators achieve the same advantage only if the polarities of the control signals and the polarity of the power supply should be altered.

Moreover, the transistors incorporated in the comparator device, i.e. the combination of the offset-compensating comparator 11 and the positive-feedback comparator, are all MOSFETs. Nonetheless, according to the present invention, the MOSFETs can be replaced by bipolar transistors.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

I claim:

1. A comparator device, comprising:
    a first comparator having an inverting output terminal, and a non-inverting output terminal, said first comparator including:
        a differential amplifier having an inverting input terminal a non-inverting input terminal, an inverting output terminal connected to said inverting output terminal of said first comparator, and a non-inverting output terminal connected to said non-inverting output terminal of said first comparator;
        a first switch circuit controlled in accordance with a first control signal and having a current path, to a first end of which an input voltage is applied;
        a second switch circuit controlled in accordance with a second control signal and having a current path, to a first end of which a reference voltage is applied;
        a first capacitor connected between said inverting input terminal of said differential amplifier, on the one hand, and a second end of the current path of said first switch circuit and a second end of the current path of said second switch circuit, on the other hand;
        a second capacitor connected between a constant voltage and said non-inverting input terminal of said differential amplifier;
        a third switch circuit controlled in accordance with the first control signal and connected between said inverting input terminal of said differential amplifier and said non-inverting output terminal of said differential amplifier; and
        a fourth switch circuit controlled in accordance with the first control signal and connected between said inverting input terminal of said differential amplifier and said inverting output terminal of said differential amplifier, wherein said first comparator outputs a first inverted voltage and a first non-inverted voltage from said inverting output terminal of said first comparator and said non-inverting output terminal of said first comparator, respectively;
    a second comparator of positive-feedback type having an inverting input terminal, an non-inverting input terminal, an inverting output terminal, and a non-inverting output terminal, for comparing the first inverted voltage with the first non-inverted voltage to generate a second inverted voltage and a second non-inverted voltage, and for outputting the second inverted voltage and the second non-inverted voltage from said inverting output terminal of said second comparator and said non-inverting output terminal of said second comparator, respectively, wherein said second comparator starts comparing the first inverted voltage with the first non-inverted output by said first comparator immediately before said first comparator finishes comparing the input voltage with the reference voltage.

2. A comparator device according to claim 1, further comprising a switching circuit connected between the inverting input terminal and non-inverting input terminal of said second comparator, for setting these input terminals at the same potential.

3. A comparator device according to claim 1, wherein said second comparator comprises:
    a first transistor of first conductivity type, whose gate is connected to the non-inverting output terminal of said second comparator and which has a current path connected between a first potential and the inverting output terminal of said second comparator;
    a second transistor of first conductivity type, whose gate is connected to the inverting output terminal of said second comparator and which has a current path connected between the first potential and the non-inverting output terminal of said second comparator;
    a third transistor of a second conductivity type, whose gate is connected to the non-inverting output terminal of said second comparator and which has a current path connected to a first end to the inverting output terminal of said second comparator;

a fourth transistor of the second conductivity type, whose gate is connected to the inverting output terminal of said second comparator and which has a current path connected at a first end to the non-inverting output terminal of said second comparator;

a first switch circuit having a current path connected, at a first end, to second ends of said third and fourth transistors and, at a second end, to second potential;

a fifth transistor of the second conductivity type, whose gate is connected to the inverting output terminal of said first comparator and which has a current path connected, at a first end, to the inverting output terminal of said second comparator and, at a second end, to the second potential;

a sixth transistor of the second conductivity type, whose gate is connected to the non-inverting output terminal of said first comparator and which has a current path connected, at a first end, to the non-inverting output terminal of said second comparator and, at a second end, to the second potential; and a second switch circuit having a current path connected, at a first end, to the inverting output terminal of said second comparator and, at a second end, to the non-inverting output terminal of said second comparator, for setting the inverting and non-inverting output terminals of said second comparator at the same potential.

4. A comparator device according to claim 3, wherein second ends of the current paths of said fifth and sixth transistors and a second end of the current path of said first switch circuit are connected to the second potential by a constant-current source.

5. A comparator device, comprising:
a first comparator having a non-inverting output terminal for outputting a first inverted voltage and an inverting output terminal for outputting a first inverted voltage, said first comparator including:
a first differential amplifier having an inverting input terminal, a non-inverting input terminal, an inverting output terminal, and a non-inverting output terminal;
a first switch circuit controlled in accordance with a first control signal and having a first end receiving an input voltage;
a second switch circuit controlled in accordance with a second control signal and having a first end receiving a reference voltage;
a first capacitor connected between second ends of said first and second switch circuits, on the one hand, and said inverting input terminal of said first differential amplifier, on the other hand;
a second capacitor connected between a constant voltage and said non-inverting input terminal of said first differential amplifier;
a third switch circuit controlled in accordance with the first control signal and connected between said inverting input terminal of said first differential amplifier and said non-inverting output terminal of said first differential amplifier;
a fourth switch circuit controlled in accordance with the first control signal and connected between said non-inverting input terminal of said first differential amplifier and said inverting output terminal of said first differential amplifier;

a second differential amplifier having an inverting input terminal, a non-inverting input terminal, an inverting output terminal connected to said inverting output terminal of said first comparator, and a non-inverting output terminal connected to said non-inverting output terminal of said first comparator;

a third capacitor connected between said non-inverting output terminal of said first differential amplifier and said inverting input terminal of said second differential amplifier;

a fourth capacitor connected between said inverting output terminal of said first differential amplifier and said non-inverting input terminal of said second differential amplifier;

a fifth switch circuit controlled in accordance with the first control signal and connected between said inverting input terminal of said second differential amplifier and said non-inverting output terminal of said second differential amplifier; and a sixth switch circuit controlled in accordance with the first control signal and connected between said non-inverting input terminal of said second differential amplifier and said inverting output terminal of said second differential amplifier; and a second comparator of positive-feedback type having an inverting input terminal receiving the first non-inverting voltage, a non-inverting input terminal receiving the first inverted voltage, an inverting output terminal, and a non-inverting output terminal, for comparing the first inverted voltage and the first non-inverted voltage to generate a second inverted voltage and a second non-inverted voltage, and for outputting the second inverted voltage and the second non-inverted voltage from said inverting output terminal of said second comparator and said non-inverting output terminal of said second comparator, respectively.

6. A comparator device comprising:
an inverting output terminal;
a non-inverting output terminal;
a first transistor of a first conductivity type, whose gate is connected to the non-inverting output terminal and which has a current path connected between the inverting output terminal and a first potential;
a second transistor of the first conductivity type, whose gate is connected to the inverting output terminal and which has a current path connected between the non-inverting output terminal and the first potential;
a third transistor of a second conductivity type, whose gate is connected to the non-inverting output terminal and which has a current path connected at a first end to the inverting output terminal;
a fourth transistor of the second conductivity type, whose gate is connected to the inverting output terminal and which has a current path connected at a first end to the non-inverting output terminal;
a first switch circuit having a current path connected, at a first end, to second ends of said third and fourth transistors and, at a second end, to second potential;
a fifth transistor of the second conductivity type, whose gate is connected to receive a reference voltage and which has a current path connected, at a first end, to the non-inverting output terminal and, at a second end, to the second potential;

a sixth transistor of the second conductivity type, whose gate is connected to receive an input voltage and which has a current path connected, at a first end, to the inverting output terminal and, at a second end, to the second potential; and a second switch circuit having a current path connected, at a first end, to the inverting output terminal and, at a second end, to the non-inverting output terminal, for setting the inverting and non-inverting output terminals at the same potential.

7. A comparator device according to claim 6, wherein second ends of the current paths of said fifth and sixth transistors and a second end of the current path of said first switch circuit are connected to the second potential by a constant-current source.

8. A comparator device comprising:
an inverting output terminal;
a non-inverting output terminal;
a first transistor of a first conductivity type, whose gate is connected to the non-inverting output terminal and which has a current path connected between the inverting output terminal and a first potential;
a second transistor of the first conductivity type, whose gate is connected to the inverting output terminal and which has a current path connected between the non-inverting output and the first potential;
a third transistor of a second conductivity type, whose gate is connected to the non-inverting output terminal and which has a current path connected at a first end to the inverting output terminal;
a fourth transistor of the second conductivity type, whose gate is connected to the inverting output terminal and which has a current path connected at a first end to the non-inverting output terminal;
a first switch circuit having a current path connected, at a first end, to second ends of the current paths of said third and fourth transistors and, at a second end, to second potential;
a fifth transistor of the second conductivity type, whose gate is connected to receive a reference voltage and which has a current path connected, at a first end, to the non-inverting output terminal and, at a second end, to the second potential;
a sixth transistor of the second conductivity type, whose gate is connected to receive an input voltage and which has a current path connected, at a first end, to the inverting output terminal and, at a second end, to the second potential;
a second switch circuit controlled in accordance with a first control signal and having a current path connected, at a first end, to the inverting output terminal and, at a second end, to a third potential; and
a third switch circuit controlled in accordance with a first control signal and having a current path connected, at a first end, to the non-inverting output terminal and, at a second end, to the third potential, and being switched together with said second switch circuit, for setting the inverting and non-inverting output terminals at the same potential.

9. A comparator device according to claim 8, wherein second ends of the current paths of said fifth and sixth transistors and a second end of the current path of said first switch circuit are connected to the second potential by a constant-current source.

10. A comparator device, comprising:
a first comparator including:
a differential amplifier having an inverting input terminal, a non-inverting input terminal, an inverting output terminal and a non-inverting output terminal;
a first switch circuit controlled in accordance with a first control signal and which has a current path having a first end to which an input voltage is applied;
a second switch circuit controlled in accordance with a second control signal which has a current path having a first end to which a reference voltage is applied;
a first capacitor connected between said inverting input terminal of said differential amplifier, on the one hand, and a second end of the current path of said first switch circuit and a second end of the current path of said second switch circuit, on the other hand;
a second capacitor which is connected, at a first end to said non-inverting input terminal of said differential amplifier and, at a second end to receive a constant voltage;
a third switch circuit controlled in accordance with the first control signal and connected between said inverting input terminal of said differential amplifier and said non-inverting output terminal of said differential amplifier; and
a fourth switch circuit controlled in accordance with the first control signal and connected between said inverting input terminal of said differential amplifier and said inverting output terminal of said differential amplifier, wherein said first comparator outputs a first inverted voltage and a first non-inverted voltage from said inverting output terminal and said non-inverting output terminal, respectively; and a second comparator of positive-feedback type having an inverting input terminal, an non-inverting input terminal, an inverting output terminal, and a non-inverting output terminal, for comparing the first inverted voltage and the first non-inverted voltage to generate a second inverted voltage and a second non-inverted voltage, and for outputting the second inverted voltage and the second non-inverted output terminal, respectively, said second comparator comprising:
a first transistor of a first conductivity type, whose gate is connected to the non-inverting output terminal of said second comparator and which has a current path connected between a first potential and the inverting output terminal of said second comparator;
a second transistor of the first conductivity type, whose gate is connected to the inverting output terminal of said second comparator and which has a current path connected between the first potential and the non-inverting output terminal of said second comparator;
a third transistor of a second conductivity type, whose gate is connected to the non-inverting output terminal of said second comparator and which has a current path connected at a first end to the inverting output terminal of said second comparator;

a fourth transistor of the second conductivity type, whose gate is connected to the inverting output terminal of said second comparator and which has a current path connected at a first end to the non-inverting output terminal of said second comparator;

a fifth switch circuit having a current path connected, at a first end, to second ends of the current paths of said third and fourth transistors and, at a second end, to a second potential;

a fifth transistor of the second conductivity type, whose gate is connected to the inverting output terminal of said first comparator and which has a current path connected, at a first end to the non-inverting output terminal of said second comparator and, at a second end, to the second potential;

a sixth transistor of the second conductivity type, whose gate is connected to the non-inverting output terminal of said first comparator and which has a current path connected, at a first end, to the non-inverting output terminal of said second comparator and, a sixth switch circuit having a current path connected, at a first end, to the inverting output terminal of said second comparator and, at a second end, to the non-inverting output terminal of said second comparator, for setting the inverting and non-inverting output terminals of said second comparator at the same potential.

11. A comparator device according to claim 10, wherein second ends of the current paths of said fifth and sixth transistors and a second end of the current path of said first switch circuit are connected to the second potential by a constant-current source.

12. A comparator device, comprising:

a first comparator having an inverting output terminal for outputting a first inverted voltage and a non-inverting output terminal for outputting a first non-inverted voltage, said first comparator including:

a first differential amplifier having an inverting input terminal, a non-inverting input terminal, an inverting output terminal connected to said inverting output terminal of said first comparator, and a non-inverting output terminal connected to said non-inverting output terminal of said first comparator;

a first switch circuit controlled in accordance with a first control signal for applying an input voltage;

a second switch circuit controlled in accordance with a second control signal for applying a reference voltage;

a first capacitor connected to said first and second switch circuits, on the one hand, and said inverting input terminal of said first differential amplifier, on the other hand;

a second capacitor connected between a constant voltage and said non-inverting input terminal of said first differential amplifier;

a third switch circuit controlled in accordance with the first control signal and connected between said inverting input terminal of said first differential amplifier and said non-inverting output terminal of said first differential amplifier;

a fourth switch circuit controlled in accordance with the first control signal and connected between said non-inverting input terminal of said first differential amplifier and said inverting output terminal of said first differential amplifier;

a third capacitor connected between said non-inverting output terminal of said first differential amplifier and said inverting input terminal of said second differential amplifier;

a fourth capacitor connected between said inverting output terminal of said first differential amplifier and said non-inverting input terminal of said second differential amplifier;

a fifth switch circuit controlled in accordance with the first control signal and connected between said inverting input terminal of said second differential amplifier and said non-inverting output terminal of said second differential amplifier;

a sixth switch circuit controlled in accordance with the first control signal and connected between said non-inverting input terminal of said second differential amplifier and said inverting output terminal of said second differential amplifier;

a second comparator of positive-feedback type having an inverting input terminal, a non-inverting input terminal, an inverting output terminal, and a non-inverting output terminal, for comparing the first inverted voltage and the first non-inverted voltage to generate a second inverted voltage and a second non-inverted voltage, and for outputting the second inverted voltage and the second non-inverted voltage from said inverting output terminal of said second comparator and said non-inverting output terminal of said second comparator, respectively.

* * * * *